(12) United States Patent
Eisaman et al.

(10) Patent No.: US 12,262,520 B2
(45) Date of Patent: Mar. 25, 2025

(54) GRAPHENE LAMINATE STRUCTURES

(71) Applicant: The Research Foundation for The State of University New York, Albany, NY (US)

(72) Inventors: Matthew Eisaman, Port Jefferson, NY (US); Jan Folkson, Williston Park, NY (US); Joseph Andrade, Stony Brook, NY (US)

(73) Assignee: The Research Foundation for The State of University New York, Albany, NY (US)

(*) Notice: Subject to any disclaimer, the term of this patent is extended or adjusted under 35 U.S.C. 154(b) by 322 days.

(21) Appl. No.: 17/298,078

(22) PCT Filed: Nov. 29, 2019

(86) PCT No.: PCT/US2019/063869
§ 371 (c)(1),
(2) Date: May 28, 2021

(87) PCT Pub. No.: WO2020/113176
PCT Pub. Date: Jun. 4, 2020

(65) Prior Publication Data
US 2022/0022350 A1    Jan. 20, 2022

Related U.S. Application Data

(60) Provisional application No. 62/773,693, filed on Nov. 30, 2018.

(51) Int. Cl.
*H05K 9/00* (2006.01)
*B32B 7/12* (2006.01)
(Continued)

(52) U.S. Cl.
CPC ............ *H05K 9/0088* (2013.01); *B32B 7/12* (2013.01); *B32B 9/007* (2013.01); *B32B 9/045* (2013.01);
(Continued)

(58) Field of Classification Search
CPC .................................................. H05K 9/0088
See application file for complete search history.

(56) References Cited

U.S. PATENT DOCUMENTS 8,227,685 B2    7/2012    Choi
8,945,772 B2    2/2015    Kawakami et al.
(Continued)

FOREIGN PATENT DOCUMENTS

CA    2827793 A1    7/2012
CN    103692735 A    4/2014
(Continued)

OTHER PUBLICATIONS

Song, W. et al., "Flexible Graphene/Polymer Composite Films in Sandwich Structues for Effective Electromagnetic Interference Shielding"; Carbon (2014); p. 67-76.
(Continued)

*Primary Examiner* — Hung V Ngo
(74) *Attorney, Agent, or Firm* — Fox Rothschild LLP

(57) ABSTRACT

Provided are methods of forming graphene laminate compositions and architectures. The method comprises: (i) contacting a graphene structure comprising one or more planar graphene sheets with a first interlayer material; (ii) depositing of a conductive material, where in the conductive material is deposited along an edge of the graphene and one end of the first interlayer; and (iii) contacting the graphene structure with a second interlayer material. Also provided are graphene laminates structures comprising doped gra-
(Continued)

phene films having improved mechanical strength, electrical mobility and optical transparency.

41 Claims, 5 Drawing Sheets

(51) Int. Cl.
    *B32B 9/00*     (2006.01)
    *B32B 9/04*     (2006.01)
    *B32B 17/10*     (2006.01)
    *B32B 27/36*     (2006.01)

(52) U.S. Cl.
    CPC .... *B32B 17/1022* (2013.01); *B32B 17/10752* (2013.01); *B32B 27/365* (2013.01); *H05K 9/0005* (2013.01); *H05K 9/0094* (2013.01); *B32B 2250/05* (2013.01); *B32B 2255/10* (2013.01); *B32B 2255/205* (2013.01); *B32B 2307/202* (2013.01); *B32B 2307/212* (2013.01); *B32B 2307/412* (2013.01); *B32B 2571/00* (2013.01)

(56) References Cited

U.S. PATENT DOCUMENTS

| | | | |
|---|---|---|---|
| 8,946,903 | B2 | 2/2015 | Sandhu |
| 9,768,443 | B2 | 9/2017 | Kawakami et al. |
| 9,779,882 | B2 | 10/2017 | Zhamu et al. |
| 9,847,184 | B2 | 12/2017 | Zhamu et al. |
| 9,899,672 | B2 | 2/2018 | Zhamu et al. |
| 9,905,373 | B2 | 2/2018 | Zhamu et al. |
| 9,922,775 | B2 | 3/2018 | Zhamu et al. |
| 9,997,611 | B2 | 6/2018 | Miyazaki et al. |
| 9,997,784 | B2 | 6/2018 | Su et al. |
| 10,415,143 | B2 | 9/2019 | Dryfe et al. |
| 10,774,195 | B2 | 9/2020 | Hamidinejad et al. |
| 10,784,516 | B2 | 9/2020 | Ochiai et al. |
| 10,850,496 | B2 | 12/2020 | Zhamu et al. |
| 10,903,020 | B2 | 1/2021 | Zhamu et al. |
| 11,127,941 | B2 | 9/2021 | Lanning et al. |
| 11,133,495 | B2 | 9/2021 | Gazda et al. |
| 11,168,404 | B2 | 11/2021 | Zhamu et al. |
| 11,296,243 | B2 | 4/2022 | Ghidiu et al. |
| 11,299,397 | B2 | 4/2022 | Lanning et al. |
| 11,539,074 | B2 | 12/2022 | Rogojina et al. |
| 11,631,893 | B2 | 4/2023 | Rogojina et al. |
| 11,760,640 | B2 | 9/2023 | Nosker et al. |
| 2005/0075412 | A1* | 4/2005 | Hishida .................. C08K 11/00 523/122 |
| 2010/0261058 | A1 | 10/2010 | Lopatin et al. |
| 2011/0011639 | A1* | 1/2011 | Visser ................ H01B 11/1008 174/105 R |
| 2011/0123776 | A1 | 5/2011 | Shin et al. |
| 2012/0070612 | A1 | 3/2012 | Lee et al. |
| 2012/0328956 | A1 | 12/2012 | Oguni et al. |
| 2013/0154994 | A1* | 6/2013 | Yang ..................... G06F 3/0445 345/174 |
| 2013/0228365 | A1 | 9/2013 | Uprety et al. |
| 2013/0270119 | A1 | 10/2013 | Wada et al. |
| 2014/0023920 | A1 | 1/2014 | Yamazaki et al. |
| 2016/0288459 | A1 | 10/2016 | Keller et al. |
| 2017/0156215 | A1 | 6/2017 | Lai et al. |
| 2017/0170012 | A1 | 6/2017 | Ko et al. |
| 2017/0179477 | A1 | 6/2017 | Walters et al. |
| 2018/0012846 | A1 | 1/2018 | Miyazaki et al. |
| 2018/0019072 | A1 | 1/2018 | Zhamu et al. |
| 2019/0372093 | A1 | 12/2019 | Zhamu et al. |
| 2021/0126243 | A1 | 4/2021 | Lanning et al. |
| 2022/0013788 | A1 | 1/2022 | Zhamu et al. |

FOREIGN PATENT DOCUMENTS

| | | |
|---|---|---|
| CN | 104934108 A | 9/2015 |
| CN | 105722679 A | 6/2016 |
| CN | 105985019 A | 10/2016 |
| CN | 106413360 A | 2/2017 |
| CN | 107418045 A | 12/2017 |
| CN | 107667071 A | 2/2018 |
| CN | 106413363 B | 3/2021 |
| GB | 2556066 B | 8/2019 |
| JP | 2012076958 A | 4/2012 |
| JP | 2012096937 A | 5/2012 |
| JP | 2013239385 A | 11/2013 |
| JP | 2015082374 A | 4/2015 |
| KR | 20110079469 A | 7/2011 |
| KR | 20110095751 A | 8/2011 |
| KR | 101196820 B1 | 11/2012 |
| KR | 20130019169 A | 2/2013 |
| KR | 101655941 B1 | 9/2016 |
| KR | 101830781 B1 | 2/2018 |
| KR | 20200008368 A | 1/2020 |
| WO | 2011081268 A1 | 7/2011 |
| WO | 2019182624 A1 | 9/2019 |
| WO | 2019182652 A1 | 9/2019 |

OTHER PUBLICATIONS

Chen, Y. et al., "Eectromagnetic Interfernce Shielding Efficiency of Polyaniline Composites Filled with Graphene Decorated with Metallic Nanapaticles"; Composites Sciences and Tecnhology (2013); vol. 80; pp. 80-86.
Lakshmi, N.V., et al, "EMI Shielding Effectiveness of Graphene Decorated with Graphene Quantum Dots and Silver Nanoparticles Reinforced PVDF Nanocomposites"; Composite Interfaces (2017); vol. 24:9; pp. 861-882.
Lin, S., et al., "Electromagnetic Interference Shieding Performance of Waterborne Polyurethane Composites filled with Silver Nanoparticles on Functionalized Graphene"; Appliced Surface Science (2016); vol. 385; pp. 436-444.
D'Aloia, A. G. et al., "Optimal Terahertz Shielding Performances of Flexible Multilayer Screens Based on Chemically Doped Graphene on Polymer Substrate", IEEE (2015) pp. 1030-1035.
D'Aloia, A. G. et al., "Terahertz Shielding Effectiveness of Graphene-Based Multilayer Screens Controlled by Electric Field Bias in a Reverberating Environment", IEEE (2015), vol. 5:4, pp. 628-636.
De Arco, L. W. et al., "Synthesis, Transfer and Devices of Single- and Few-Layer Graphene by Chemical Vapor Deposition", IEEE Transactions of Nanotechnology (2009), vol. 8:2, pp. 135-138.
Du, X. et al., "Graphene/Epoxy Interleaves for Delamination Toughening and Monitoring of Crack Damage in Carbon Fibre/Epoxy Composite Laminates", Composites Science and Technology (2017), vol. 140, pp. 123-133.
Kasry, A. et al., "Chemical Doping of Large-Area Stacked Graphene Films for Use as Transparent, Conducting Electrodes", ACS Nano (2010), vol. 4:7, pp. 3839-3844.
Kim, K.K., et al., "Enhancing the Conductivity of Transparent Graphene Films via Doping", Nanotechnology (2010), vol. 21, 7 pgs.
Kim, S. eta l., "Electromagnetic Interference (EMI) Transparent Shielding of Reduced Graphene Oxide (RGO) Interleaved Structure Fabricated by Electrophoretic Deposition", ACS Applied Materials and Interfaces (2014), vol. 6, p. 17647-17653.
Wan, Y. et al., "Graphene Paper for Exceptional EMI Shielding Performance Using Large-Sized Graphene Oxide Sheets and Doping Strategy", Carbon (2017), 8 pgs.
Wu, T. et al., "Facile Synthesis of Ag Interlayer Doped Graphene by Chemical Vapor Deposition Using Polystyrene as Solid Carbon Source", ACS Applied Materials and Interfaces (2012), vol. 4, pp. 2041-2047.

* cited by examiner

GRAPHENE LAMINATE STRUCTURES

FIELD OF THE INVENTION

This present disclosure relates to graphene laminate compositions and architectures having improved mechanical strength, electrical mobility and optical transparency, and to methods of preparing the graphene laminate compositions and architectures.

BACKGROUND

Numerous applications require a laminate window material that is optically transparent (for visual clarity), strong (for protection, security, and long lifetime), and electrically conductive (for the reduction of electromagnetic interference, i.e. EMI shielding). For example, military and security applications often require optically transparent windows that are both ballistic and blast resistant and block the transmission of electromagnetic radiation. Windows capable of EMI shielding are typically composed with a thin film or grid of conductive metal or material (including, but not limited to copper or silver) on, or incorporated into, a transparent substrate (including, but not limited to glass, acrylic, and glass-polymer laminates).

EMI shielding films have an inherent tradeoff between the shielding effectiveness and the optical transparency. For a given material, the shielding effectiveness can be increased by making the material thicker, but at the expense of reduced optical transparency. New materials are desired that, relative to state of the art, yield higher optical transparency for a given shielding effectiveness.

Laminate glass architectures (for example, ballistic and/or blast resistant glass) suffer from a similar tradeoff: ballistic and blast protection can be improved by adding thicker or additional layers of glass or plastic, but at the expense of reduced optical transparency and physical weight. New materials are desired that, when incorporated into standard architectures, yield higher optical transparency for the same protection.

SUMMARY OF THE INVENTION

It is an object of the present invention to provide a method of forming graphene laminate structures that provide EMI shielding, for example, when incorporated into laminate windows. It is another object to provide graphene laminates and laminated window panels that provide EMI shielding. In another aspect, the invention provides a laminated window panel that provides EMI shielding and at least one or more of impact resistance, blast resistance and ballistic resistance.

The invention provides a method for producing a graphene laminate, the method comprising: (i) contacting a graphene structure comprising one or more planar graphene sheets with a first interlayer material; (ii) depositing of a conductive material, wherein the conductive material is deposited along an edge of the graphene and one end of the first interlayer; and (iii) contacting the graphene structure with a second interlayer material.

The invention further provides a graphene laminate structure that comprises: one or more layers of graphene between a first interlayer and a second interlayer; and a conductive material along an edge of the graphene and one end of the interlayers. The graphene laminate structure is incorporated into laminate window structures to provide EMI shielding and preferably at least one or more of impact resistance, blast resistance and ballistic resistance A more complete understanding of the present invention, as well as further features and advantages of the present invention, will be obtained by reference to the following detailed description of drawings.

DETAILED DESCRIPTION OF THE INVENTION

Figure 1:
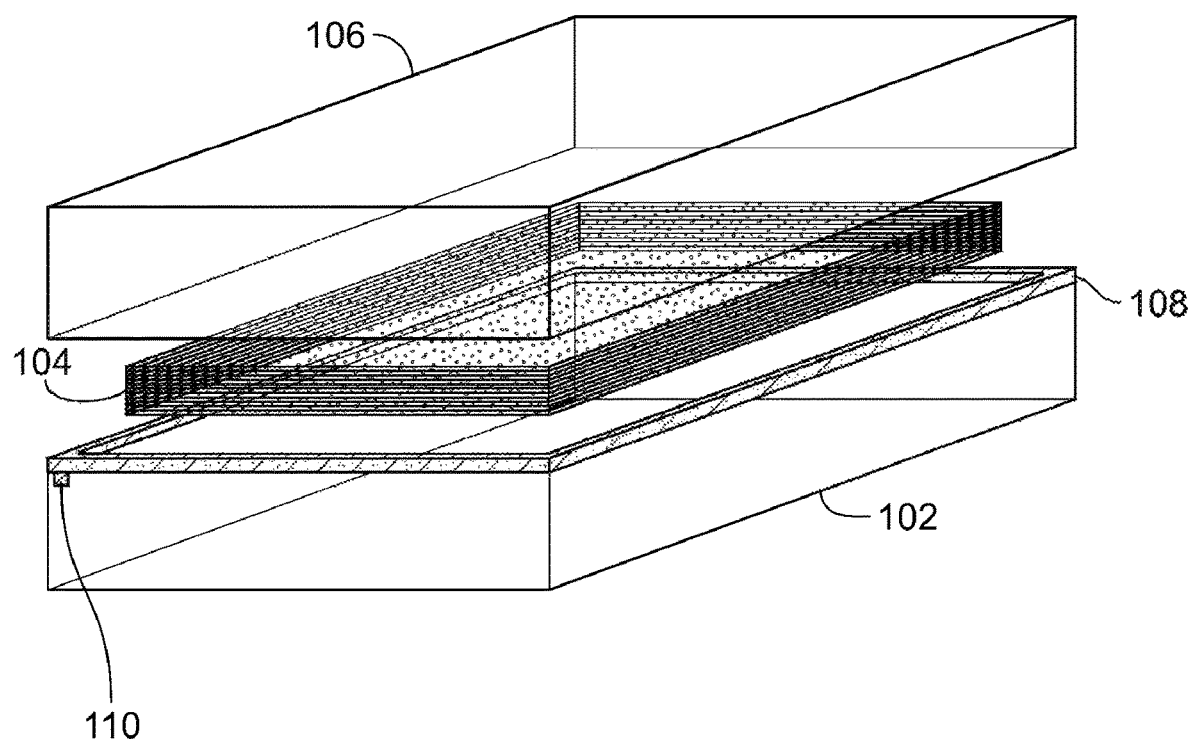
FIG. 1 is a schematic view of a graphene laminate structure.
Figure 2A:
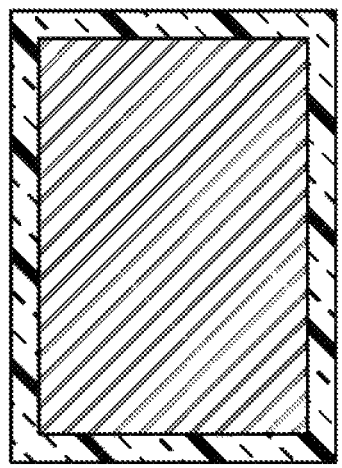
FIGS. 2A-2D are illustrations of exemplary spatial embodiments for conductive grounding material.
Figure 2B:
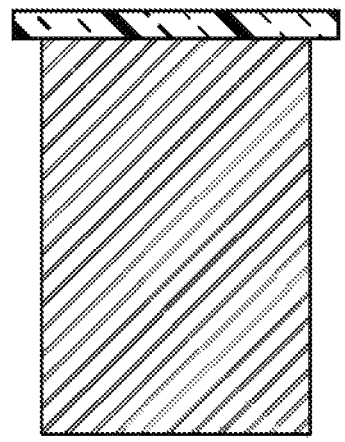
Figure 2C:
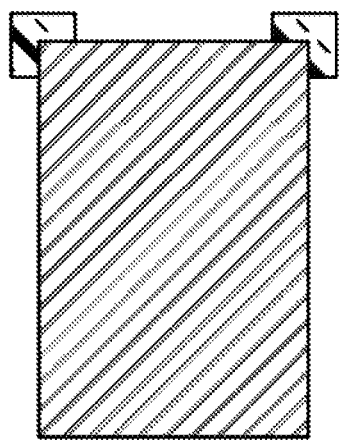
Figure 2D:
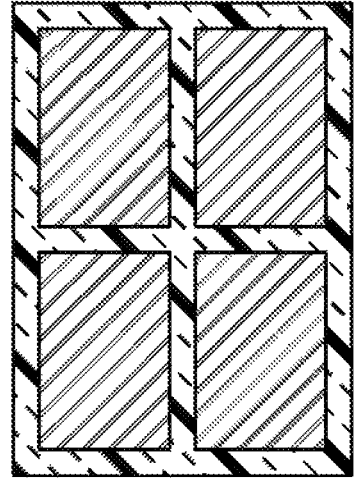

Provided herein are graphene laminates structures comprising doped graphene films that have improved mechanical strength, electrical mobility and optical transparency. Further provided are methods of forming graphene laminates comprising doped graphene films.

Also provided are graphene laminate structures comprising:
  one or more layers of graphene interposed between a first interlayer and a second interlayer; and a conductive material along at least one edge of the graphene layer.

Also provided are laminate windows comprising:
  one or more layers of graphene interposed between a first interlayer and a second interlayer;
  a conductive material along at least one edge of the graphene layer;
  one or more glass or polycarbonate panels adjacent to the first interlayer and/or the second interlayer.

Graphene films combine mechanical strength, electrical mobility, and optical transparency (2.3% absorption per layer over all visible wavelengths) into one material. Graphene films have been shown to increase the strength of polymers. However, in order for graphene to serve as a high-performance EMI shielding material, it should have a sufficiently high electrical conductivity (proportional to the product of the graphene mobility and carrier concentration) in the plane of the film. Regarding mobility, the extremely high mobility values often quoted for graphene are under conditions where it is suspended, rather than in contact with a substrate. Achieving a high value of mobility when in contact with a substrate involves control over the scattering of graphene charge carriers through substrate interactions that can reduce mobility values. Regarding carrier concentration, intrinsic (undoped) graphene has a low carrier concentration. To achieve sufficiently high carrier concentrations to serve as high-performance EMI shielding can be improved by doping graphene (donating electrons to serve as charge carriers or borrowing electrons so that holes serve as charge carriers). Graphene can be doped to sufficiently high values of carrier concentration without altering the optical transmission of 2.3% per layer, thus opening up the possibility of highly optically transparent graphene films that provide strong EMI shielding. Intercalation compounds of alkali metals with multi-layer graphene (such as $LiC_6$) can also be formed, which are so strongly doped that optical absorption is strongly decreased below 2.3% per layer due to the occupation of conduction band states by electrons.

The term "graphene" as used herein refers to a polycyclic aromatic molecule formed from a plurality of carbon atoms covalently bound to each other. The covalently bound carbon atoms may form a 6-membered ring as a repeating unit, or may further include at least one of a 5-membered ring and a 7-membered ring. Accordingly, in the graphene, the covalently bound carbon atoms (generally having sp2 hybridization) form a single layer. The graphene may have various structures which are determined according to the amount of the 5-membered rings and/or 7-membered rings which may be contained in the graphene. The graphene may have a single layer (single-layer graphene) or a plurality of layers (multi-layer graphene, also sometimes referred to as few-layer graphite). Graphene layers in multi-layer graphene each occupy about 340 μm, and so multi-layer graphene (1-50 layers) may have a thickness of about 0.3 nm to about 170 nm, or in other aspects from about 1 nm to about 30 nm. These layer spacings increase by about 10% (from 340 pm to 370 pm per layer) for $LiC_6$ relative to unintercalated multi-layer graphene.

As used herein, the term "doping" refers to a process of providing charge-carriers by supplying electrons to, or removing electrons from, a part of a conjugated bonding it-orbit to provide conductivity to a conjugated compound, e.g., a polycyclic aromatic carbon compound, such as graphene. Here, the process of adding electrons or removing electrons is referred to as "doping".

The term "dopant" as used herein refers an organic dopant, an inorganic dopant, or a combination including at least one of the foregoing.

FIG. 1, for example, provides an illustration of an exemplary graphene laminate structure comprising (i) a graphene structure comprising one or more planar graphene sheets adjacent to a first interlayer material; (ii) a conductive material along an edge of the graphene and one end of the first interlayer; and (iii) a second interlayer material.

The graphene laminate structure of FIG. 1 may be formed, for example, by (i) contacting a graphene structure comprising one or more planar graphene sheets with a first interlayer material; (ii) depositing of a conductive material, where in the conductive material is deposited along an edge of the graphene and one end of the first interlayer; and (iii) contacting the graphene structure with a second interlayer material. In an embodiment, steps (ii) and (iii) can be sequentially repeated 1-5 times.

According to an exemplary embodiment, the graphene laminate comprises a first interlayer 102, a graphene structure 104, a second interlayer 106, a conductive material 108, and optionally a conductive tab 110.

The first and second interlayer materials can be the same or different materials. The interlayers are preferable made of polymers, for example polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers. Preferred polymers include poly(methylmethacrylate), polyvinyl butyral, ethylene-vinyl acetate, thermoplastic polyurethane, polyethylene terephthalate, thermoset ethylene-vinyl acetate, polycarbonate and polyethylene.

In one aspect, one or more of the interlayers further comprises a dopant that increases the conductivity of the adjacent graphene. The dopant in the interlayer serves to increase the concentration of charge carriers in the adjacent graphene layer. In a further embodiment, the dopant may be an alkali-metal salt. The alkali metal of the salt may be selected from Na, Cs, Li, K, and Rb. In a further aspect, the anion in the alkali metal salt can be perchlorate, iodide, and carbonate. In one aspect, the alkali metal salt is $MClO_4$ or MI, where M can be Li, Na or K. The concentration of alkali metal is in the range of about 2% to about 45% by weight (w/w). In an embodiment, the alkali metal ions intercalate in between the layers of the multi-layer graphene to form $MC_{72}$, $MC_{36}$, $MC_{18}$, $MC_{12}$, and/or $MC_6$ (i.e., $LiC_{72}$, $LiC_{36}$, $LiC_{18}$, $LiC_{12}$, and/or $LiC_6$).

In another aspect, the alkali metal dopant is intercalated into the graphene structure 104 prior to its incorporation into a graphene laminate structure. The alkali metal dopant may be Na, Cs, Li, K, and Rb, with Li, Na and K being preferred. The graphene may be doped with the alkali metal dopant by, for example, contacting the graphene with a suitable electrolyte solution. The counterion to the alkali metal may be any anion that is unreactive and stable under the conditions of the graphene structure fabrication and use. Preferred counterions include $ClO_4^-$ and $PF_6^-$. The electrolyte solution further comprises a solvent for the alkali metal salt. Preferred solvents include ethylene carbonate (EC), diethyl carbonate (DEC), dimethyl carbonate (DMC), ethyl methyl carbonate (EMC), and mixtures thereof. The alkali metal salt may present in the electrolyte solution in a concentration from 0.5 to 2 M, or in a concentration sufficient to form $MC_{72}$, $MC_{36}$, $MC_{18}$, $MC_{12}$, and/or $MC_6$ (i.e., $LiC_{72}$, $LiC_{36}$, $LiC_{18}$, $LiC_{12}$, and/or $LiC_6$), and preferably $MC_6$. The electrolyte solution may further be in contact with a metal source, such as a metal foil, which maintains a high concentration of alkali metal in the electrolyte solution. In one embodiment, the multilayer graphene is contacted with 1-1.2 M $LiPF_6$ in 1:1 wt ratio of EC/DEC (Lithium hexafluorophosphate solution in ethylene carbonate and diethyl carbonate, while the electrolyte is contacted with Li metal foil. The alkali metal ions are intercalated into the multilayer graphene (for example, forming $LiC_{72}$, $LiC_{36}$, $LiC_{18}$, $LiC_{12}$, and/or $LiC_6$). The intercalated graphene is then used to form the laminate structure as provided herein. In this case, the interlayers preferably do not include additional alkali metal ions.

In an embodiment, a liquid adhesive solution is applied between the graphene structure 104 and at least one of the first interlayer 102 and second interlayer 106. The liquid adhesive preferably comprises a solvent and one or more polymers. The polymers include, for example, polyamides, polyimides, polychloroethylenes, polyurethanes, polyvinylethers, polythioureas, polyacrylates, polycarbonates, polyesters, polyethylenes, polypropylenes, polysytrenes, PTFE, polyethylacetates, polyvinylacetates and fluoropolymers. Preferred polymers include poly(methylmethacrylate), polyvinyl butyral, ethylene-vinyl acetate, thermoplastic polyurethane, polyethylene terephthalate, thermoset ethylene-vinyl acetate, polycarbonate and polyethylene. Preferred solvents include water, chlorobenzene, acetone, methanol, N-methyl-2-pyrrolidone, tetrahydrofuran, dimethylformamide, hexane, toluene, isopropyl alcohol, acetonitrile, chloroform, acetic acid, 2-methoxyethanol, n-butylamine, or combinations thereof. The liquid adhesive solution can be cured with heat. In an embodiment, the liquid adhesive solution is cured to a final temperature in the range of about 130° C. to about 160° C., and the final temperature can be held or about 5 minutes to about 4 hours. The adhesive may further comprise a dopant that increases the conductivity of the adjacent graphene, as described above.

In an embodiment, the graphene laminate can include one or more spacer layers between one or more of the graphene layers.

The graphene structure 104 can be prepared by chemical vapor deposition (CVD). In this process, graphene is formed on a catalytic metal substrate through the decomposition of hydrocarbon precursors such as methane, commonly mixed with hydrogen, at suitable temperatures (~1000 C-1100 C) and pressures (~1 mTorr-10 Torr). (G. Deokar et al., Towards high quality CVD graphene growth and transfer, Carbon, 89, 82-92 (2015); N. C. Bartelt and K. F. McCarty, *Graphene growth on metal surfaces*, MRS Bulletin, 37, 1158-1165 (2012)). Suitable metal substrates may be copper, nickel, platinum, or iridium. To achieve uniform single-layer graphene sheets, most often a copper substrate is used. For multi-layer graphene, either copper or, more commonly, nickel is selected. These specific metals are chosen as they both act as a catalyst for graphene growth and due to the similar lattice spacing to that of graphene, provide minimal lattice mismatch between the materials.

The graphene structure 104 comprises 1-50 planar graphene sheets. The 1-50 graphene sheets can be applied to the interlayer material individually or as a growth of multi-layer graphene. In one aspect, the graphene sheets are intercalated with alkali metal ions.

Conductive material 108 provides a ground source. In an embodiment, the conductive material 108 may be a metal or adhesive tape. Representative metals include copper, silver and aluminum. The conductive material may be deposited by physical vapor deposition, thermal evaporation, sputtering or plating. The conductive material 108 can be deposited along an edge of the graphene in numerous spatial orientations. Examples of possible spatial orientations of the conductive material are illustrated in FIGS. 2A-D. For example, the conductive material can be present around the border of the graphene or along one edge, or on one spot along the edge, however the invention is not limited to these exemplary patterns. A small overlap between the conductive material and graphene is preferred to allow for sufficient electrical contact. In the embodiment shown in 2D, the graphene may not be one continuous sheet over the entire area of the interlayer, but may be tiled, with the conductive material connecting tiles along their adjacent edges.

The described methods can be used to prepare a graphene laminate that provides EMI shielding, wherein the graphene laminate comprises one or more layers of graphene between a first interlayer and a second interlayer; and a conductive material along an edge of the graphene and one end of the interlayers.

Figure 3:
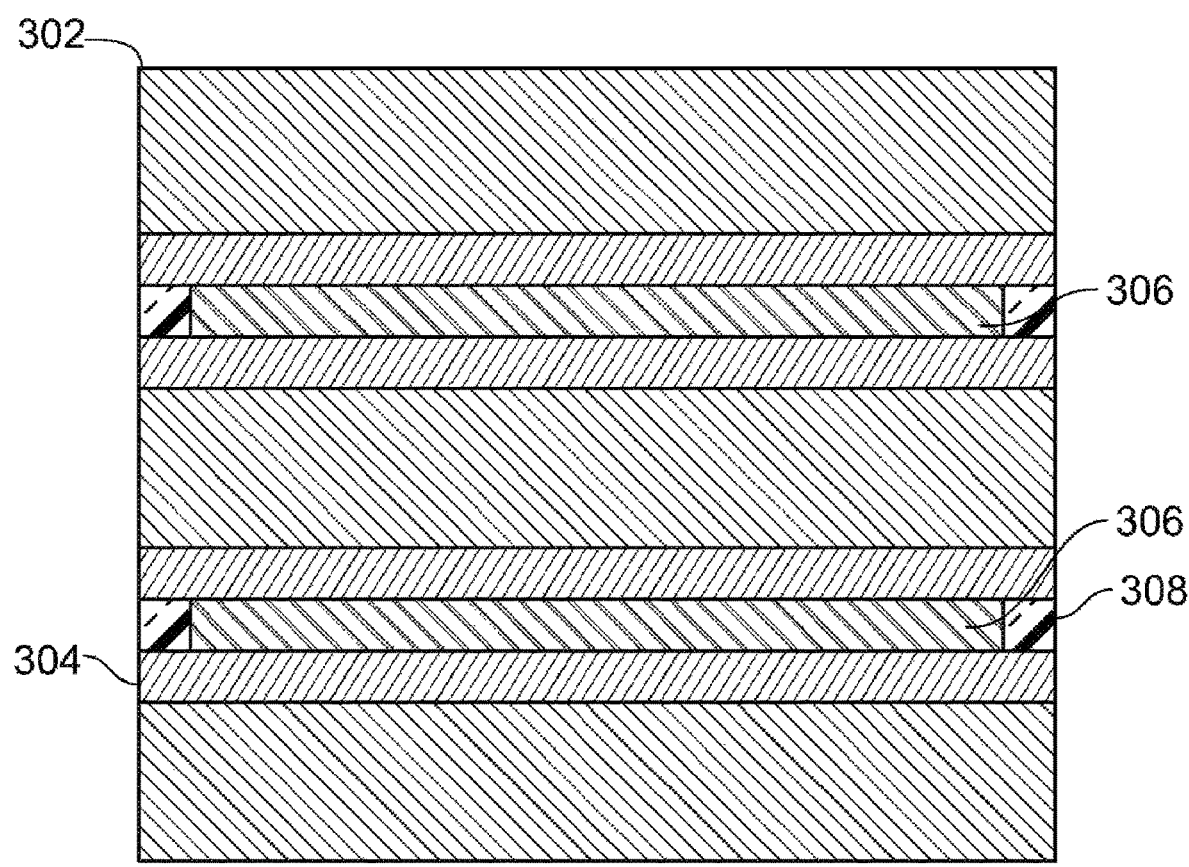
FIG. 3 is a schematic view of a laminated glass panel.

In an embodiment, the invention provides a laminated window panel that provides EMI shielding and at least one or more of impact resistance, blast resistance, and ballistic resistance, wherein the laminated window panel comprises two or more sheets of glass and/or polycarbonate bonded between one or more sheets of the graphene laminate structure of FIG. 1. As shown in FIG. 3, the laminated window panel comprises one or more layers of glass or polycarbonate 302, wherein the laminate can comprise layers of glass, or layers of polycarbonate, or both glass and polycarbonate. The laminated glass panel further comprises one or more interlayers 304, as previously defined. The laminated glass panel further comprises one or more graphene structure(s) 306, and a conductive material 308. The graphene structure may comprise from 1-50 layers of graphene. In preferred embodiments of the laminate window of FIG. 3, each of the graphene structures 306 are comprised of a film of multi-layer graphene having from 1-50 graphene layers, which is preferably intercalated with alkali metal ions. The graphene structure 306 may further comprise multiple laminates of interlayer/multilayer graphene (i.e., interlayer/multilayer graphene/interlayer/multilayer graphene/interlayer/ . . . , etc.).

Figure 4:
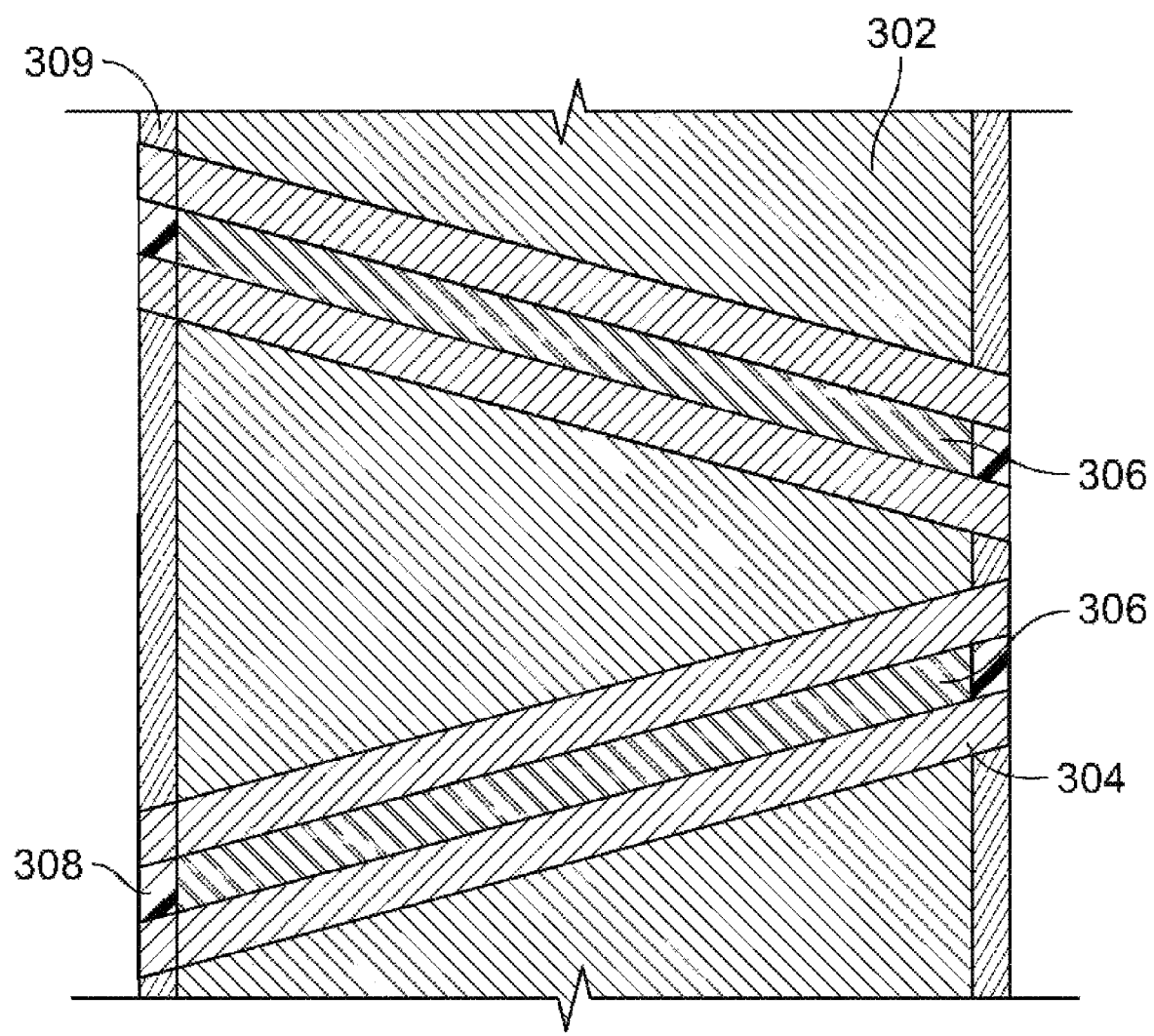
FIG. 4 is a schematic view of an alternative laminated glass panel.

The particular orientation of the various embodiments in the drawings is for illustrative purposes only, and the embodiments may be rotated relative to the shown orientations in some applications. An example of this is shown in FIG. 4, where the graphene structures are angled in a sawtooth pattern. Since the graphene structures largely provide EMI shielding via reflection of incoming RF radiation, the sawtooth pattern reflects the rejected power to the edge of the laminate structure, rather than creating cavities between adjacent graphene structures where radiation may be trapped, for example by reflecting back and forth.

FIG. 4 also shows an optional RF absorbing layer 309 to absorb the RF radiation that is reflected to the edge of the structure. The radiation-absorbent material is a material which has been specially designed and shaped to absorb incident RF radiation. The optional RF absorbing layer may be composed and any suitable material(s) that absorb RF radiation, such as carbon foam, silicon carbide and or carbon nanotubes. The carbon foam radiation-absorbent material may consist of a fireproofed urethane foam loaded with conductive carbon black (carbonyl iron spherical particles and/or crystalline graphite particles) in mixtures between 0.05% and 0.1%.

Figure 5:
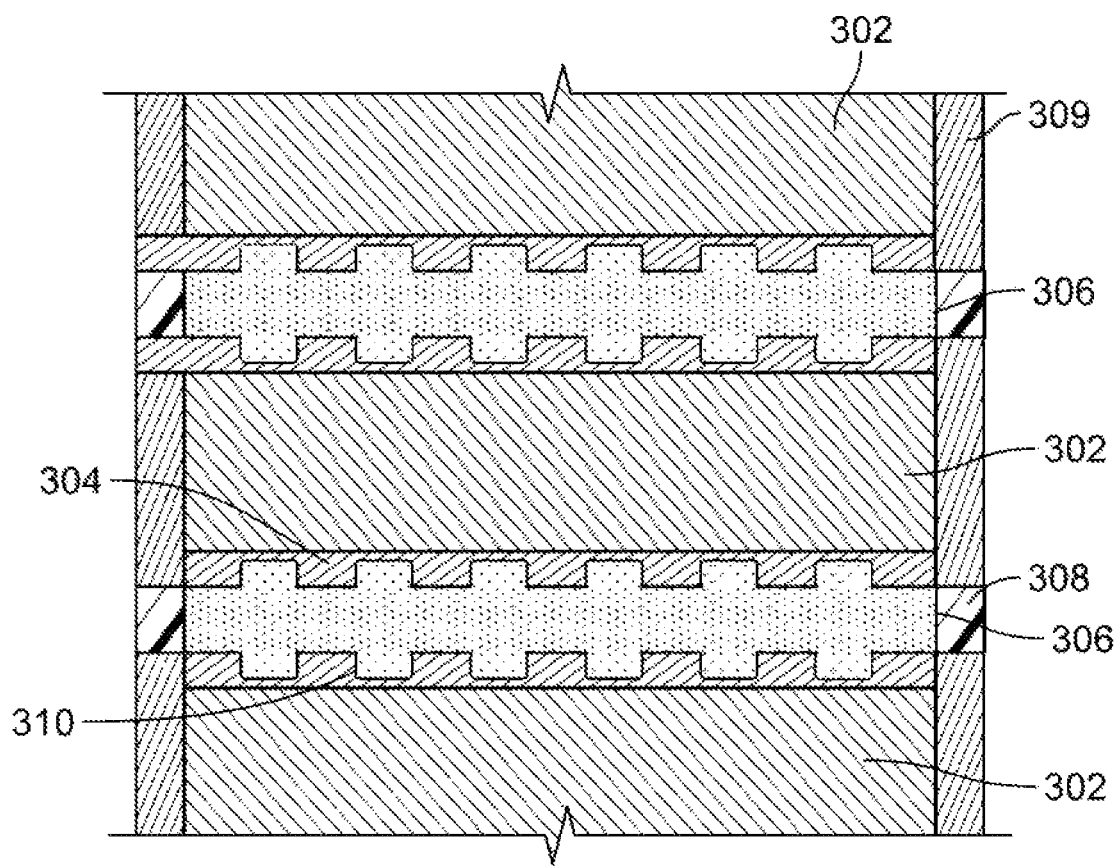
FIG. 5 is a schematic view of an additional alternative laminated glass panel.

This same effect of shunting reflected power to the edge of the structure may also be accomplished by structuring the surface of the graphene structures, as shown in FIG. 5, rather than (or in tandem with) angling the entire layer. These structures may be hierarchical, with patterning as small as few micron on top of patterning at tens of microns and so on, up to cm-scale patterns. FIG. 5 shows a schematic view of a glass panel in which the graphene structure 306 has structured (or patterned) 310. These structures may be formed by stamping or etching the patterning into the interlayer. When the graphene structure is contacted with the interlayer, it conformally coats the interlayer, assuming the underlying spatial structure of the interlayer. While FIG. 5 shows square patterning, the patterning may be any shape including sawtooth, triangular, hemispherical, etc.

The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

We claim:

1. A method of forming a graphene laminate, the method comprising:
   (i) contacting a graphene structure comprising one or more planar graphene sheets with a first interlayer material;
   (ii) depositing of a conductive material, wherein the conductive material is deposited along an edge of the graphene structure and one end of the first interlayer material, and provides a ground source; and
   (iii) contacting the graphene structure with a second interlayer material,
   wherein the interlayer materials comprise one or more polymers, and
   wherein one or both of the interlayer materials further comprises an alkali metal salt.

2. The method of claim 1, further comprising a liquid adhesive solution between the graphene structure and at least one of the first and second interlayer material.

3. The method of claim 2, wherein the liquid adhesive solution is cured with heat.

4. The method of claim 3, wherein the liquid adhesive solution is cured to a final temperature in the range of 130° C. to 160° C.

5. The method of claim 4, wherein the final temperature is held for about 5 minutes to about 4 hours.

6. The method of claim 2, wherein the liquid adhesive solution comprises a solvent and a polymer.

7. The method of claim 6, wherein the polymer is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, polyvinylacetates, polyvinyl butyral and fluoropolymers.

8. The method of claim 7, wherein the polymer is selected from the group consisting of PTFE, poly(methyl methacrylate), ethylene vinyl acetate, thermoplastic polyurethane, polyethylene terephthalate, polycarbonate and polyethylene.

9. The method of claim 1, further comprising one or more spacer layers between the one or more planar graphene sheets.

10. The method of claim 1, wherein the polymer is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, polyvinylacetates, polyvinyl butyral and fluoropolymers.

11. The method of claim 10, wherein the polymer is selected from the group consisting of PTFE, poly(methyl methacrylate), ethylene vinyl acetate, thermoplastic polyurethane, polyethylene terephthalate, polycarbonate and polyethylene.

12. The method of claim 1, wherein the cation in the alkali metal salt is selected from the group consisting of Na, Cs, Li, K, and Rb.

13. The method of claim 12, wherein the anion in the alkali metal salt is selected from the group consisting of a perchlorate, iodide, and carbonate.

14. The method of claim 1, wherein the one or more planar graphene sheets are intercalated with alkali metal ions.

15. The method of claim 14 wherein compounds formed from the one or more planar graphene sheets and alkali metal ions are selected from the group consisting of $LiC_{72}$, $LiC_{36}$, $LiC_{18}$, $LiC_{12}$, and/or $LiC_6$.

16. The method of claim 1, wherein the graphene structure comprises 1-50 planar graphene sheets.

17. The method of claim 1, wherein the one or more planar graphene sheets are applied to the interlayer materials individually.

18. The method of claim 1, wherein the one or more planar graphene sheets are applied to the interlayers as a growth of multi-layer graphene, wherein the multi-layer graphene comprises 1-50 planar graphene sheets.

19. The method of claim 1, wherein steps (ii) and (iii) are both sequentially repeated 1-5 times.

20. The method of claim 1, wherein the conductive material is selected from the group consisting of a metal or adhesive tape.

21. The method of claim 20, wherein the metal is selected from the group consisting of copper, silver or aluminum.

22. The method of claim 1, wherein the depositing of a conductive material is selected from physical vapor deposition, thermal evaporation, sputtering and plating.

23. A graphene laminate that provides EMI shielding wherein the graphene laminate comprises:
one or more layers of graphene between a first interlayer material and a second interlayer material; and
a conductive material along an edge of the graphene and one end of the interlayer materials,
wherein the conductive material provides a ground source, and
wherein the first interlayer material further comprises an alkali metal salt.

24. The graphene laminate of claim 23, further comprising a liquid adhesive solution between the graphene structure and at least one of the first and second interlayer material.

25. The graphene laminate of claim 24, wherein the liquid adhesive solution is a liquid solution comprising a solvent and a polymer.

26. The graphene laminate of claim 25, wherein the polymer is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, polyvinylacetates, polyvinyl butyral and fluoropolymers.

27. The graphene laminate of claim 26, wherein the polymer is selected from the group consisting of PTFE, poly(methyl methacrylate), ethylene vinyl acetate, thermoplastic polyurethane, polyethylene terephthalate, polycarbonate and polyethylene.

28. The graphene laminate of claim 23, wherein the liquid adhesive solution is cured with heat.

29. The graphene laminate of claim 23, further comprising one or more spacer layers between one or more layers of graphene.

30. The graphene laminate of claim 23 wherein the interlayer materials are comprised of one or more polymers.

31. The graphene laminate of claim 30, wherein the polymer is selected from the group consisting of polyamides, polyimides, polychloroethylenes, polyurethanes, polyvinylethers, polythioureas, polyacrylates, polycarbonates, polyesters, polyethylenes, polypropylenes, polysytrenes, polyvinylacetates, polyvinyl butyral and fluoropolymers.

32. The graphene laminate of claim 31, wherein the polymer is selected from the group consisting of PTFE, poly(methyl methacrylate), ethylene vinyl acetate, thermoplastic polyurethane, polyethylene terephthalate, polycarbonate and polyethylene.

33. The graphene laminate of claim 23, wherein the cation in the alkali metal salt is selected from the group consisting of Na, Cs, Li, K, Rb.

34. The graphene laminate of claim 23, wherein the anion in the alkali metal salt is selected from the group consisting of a perchlorate, iodide, and carbonate.

35. The graphene laminate of claim 23, wherein the one or more graphene layers are intercalated with alkali metal ions.

36. The graphene laminate of claim 35, wherein the one or more graphene layers comprise 1-50 planar graphene layers intercalated with alkali metal ions.

37. The graphene laminate of claim 36, wherein compounds formed from the one or more graphene layers and alkali metal ions are selected from the group consisting of such as $LiC_{72}$, $LiC_{36}$, $LiC_{18}$, $LiC_{12}$, and/or $LiC_6$.

38. The graphene laminate of claim 23, wherein the conductive material is selected from the group consisting of a metal or an adhesive tape.

39. The graphene laminate of claim 38, wherein the metal is selected from the group consisting of copper, silver or aluminum.

40. A method of forming a graphene laminate, the method comprising:
(i) contacting a graphene structure comprising one or more planar graphene sheets with a first interlayer material;
(ii) depositing of a conductive material, wherein the conductive material is deposited along an edge of the graphene structure and one end of the first interlayer material, and provides a ground source; and
(iii) contacting the graphene structure with a second interlayer material,
wherein the one or more planar graphene sheets are intercalated with alkali metal ions, and
wherein compounds formed from the one or more planar graphene sheets and alkali metal ions are selected from the group consisting of $LiC_{72}$, $LiC_{36}$, $LiC_{18}$, $LiC_{12}$, and/or $LiC_6$.

41. A graphene laminate that provides EMI shielding wherein the graphene laminate comprises:
one or more layers of graphene between a first interlayer material and a second interlayer material; and
a conductive material along an edge of the graphene and one end of the interlayer materials,
wherein the conductive material provides a ground source,
wherein the one or more graphene layers are intercalated with alkali metal ions,
wherein the one or more graphene layers comprise 1-50 planar graphene layers intercalated with alkali metal ions, and
wherein compounds formed from the one or more graphene layers and alkali metal ions are selected from the group consisting of such as $LiC_{72}$, $LiC_{36}$, $LiC_{18}$, $LiC_{12}$, and/or $LiC_6$.

\* \* \* \* \*